US010955523B1

(12) United States Patent
Mikhalevsky

(10) Patent No.: US 10,955,523 B1
(45) Date of Patent: Mar. 23, 2021

(54) DEEP OCEAN LONG RANGE UNDERWATER NAVIGATION ALGORITHM (UNA) FOR DETERMINING THE GEOGRAPHIC POSITION OF UNDERWATER VEHICLES

(71) Applicant: Leidos, Inc., Reston, VA (US)

(72) Inventor: Peter N. Mikhalevsky, Arlington, VA (US)

(73) Assignee: Leidos, Inc., Reston, VA (US)

( * ) Notice: Subject to any disclaimer, the term of this patent is extended or adjusted under 35 U.S.C. 154(b) by 638 days.

(21) Appl. No.: 15/804,695

(22) Filed: Nov. 6, 2017

Related U.S. Application Data

(60) Provisional application No. 62/417,738, filed on Nov. 4, 2016.

(51) Int. Cl.
*G01S 5/22* (2006.01)
*G06F 30/20* (2020.01)

(52) U.S. Cl.
CPC ............... *G01S 5/22* (2013.01); *G06F 30/20* (2020.01)

(58) Field of Classification Search
CPC ...... G06F 30/20; G06F 2111/10; G06F 30/13; G06F 17/16; G06F 17/18; G06F 30/00;
(Continued)

(56) References Cited

U.S. PATENT DOCUMENTS 5,691,957 A * 11/1997 Spiesberger ............ G01S 19/14
367/3
5,729,234 A * 3/1998 Stetson, Jr. ............ F41G 7/2206
342/139
(Continued)

OTHER PUBLICATIONS

J. C. Kinsey, et al. "A Survey of Underwater Vehicle Navigation: Recent Advances and New Challenges," IFAC Conference of Maneuvering and Control of Marine Craft 88, Sep. 2006.
(Continued)

*Primary Examiner* — Hovhannes Baghdasaryan
*Assistant Examiner* — Amie M Ndure
(74) *Attorney, Agent, or Firm* — Dawn-Marie Bey; Bey & Cotropia PLLC

(57) ABSTRACT

An underwater navigation algorithm (UNA) uses acoustic signals transmitted in the ocean from sources at known positions to compute a position underwater for a vehicle that requires no initial a priori position or any ocean sound speed information or any initial GPS position that would require surfacing. The UNA consists of two parts, (1) the Cold Start Algorithm (CSA) and (2) the CSA with Modeling (CSAM). The underwater vehicle needs to be equipped with only a single hydrophone acoustic receiver and an onboard processor. The CSA requires only measuring the travel time of the end of the arrival coda (EOC) from each of the sources to compute a position. The CSAM is a post CSA procedure to calculate a higher accuracy position using the CSA position. CSAM utilizes the CSA position and a 4D sound speed field derived from an ocean 4D General Circulation Model (GCM) constrained using Ocean Acoustic Tomography (OAT) in the ocean area of operation and further includes (1) computing a modeled result with an acoustic propagation modeling code that is compared with the received acoustic data using a known procedure called "bulk shifting" and/or (2) a new proposed procedure that uses calculated group speeds from the 4D sound speed field, to provide a higher accuracy estimate of the receiver position.

18 Claims, 8 Drawing Sheets

(8 of 8 Drawing Sheet(s) Filed in Color)

(58) Field of Classification Search
CPC .......... G06F 16/51; G06F 17/15; G06F 30/15; G06F 11/3684; G06F 16/215; G06F 17/10; G06F 17/13; G06F 2111/20; G06F 2113/24; G06F 2119/08; G06F 30/398; G06F 11/263; G06F 11/3086; G06F 11/3608; G06F 11/3628; G06F 11/3636; G06F 11/3664; G06F 11/3688; G06F 12/084; G06F 12/0842; G06F 16/22; G06F 16/2237; G06F 16/2264; G06F 16/2423; G06F 16/245; G06F 16/24568; G06F 16/248; G06F 16/254; G06F 16/258; G06F 16/283; G06F 16/285; G06F 16/288; G06F 16/29; G06F 16/335; G06F 16/35; G06F 16/9024; G06F 16/90332; G06F 19/90335; G06F 16/90335; G06F 16/9038; G06F 16/906; G06F 16/93; G06F 17/142; G06F 2111/02; G06F 2111/06; G06F 2113/12; G06F 2113/22; G06F 2117/08; G06F 2119/10; G06F 21/552; G06F 21/57; G06F 21/60; G06F 21/6245; G06F 21/6254; G06F 2212/455; G06F 2212/601; G06F 30/17; G06F 30/23; G06F 30/25; G06F 30/28; G06F 30/30; G06F 30/33; G06F 30/333; G06F 30/36; G06F 30/367; G06F 3/017; G06F 3/04842; G06F 3/04847; G06F 3/0604; G06F 3/0631; G06F 3/0659; G06F 3/0664; G06F 3/068; G06F 40/117; G06F 40/166; G06F 40/20; G06F 8/71; G06F 9/3877; G06F 9/3885; G06F 9/44505; G06F 9/448; G06F 9/5016; G06F 9/5066; G06F 9/54; G06F 9/541; G06F 9/544; G06F 9/547; G01V 99/005; G01V 11/00; G01V 2210/66; G01V 99/00; G01V 9/00; E21B 49/00; E21B 21/01; E21B 21/06; E21B 41/00; E21B 41/0092; E21B 43/00; E21B 43/267; E21B 47/06; E21B 47/065; E21B 49/005; E21B 49/08; E21B 7/00; A61B 2034/105; A61B 34/10; A61B 5/02007; A61B 5/02028; A61B 5/026; A61B 5/7275; A61B 6/032; A61B 6/0407; A61B 6/102; A61B 6/504; A61B 6/507; A61B 6/5217; A61B 6/54

See application file for complete search history.

(56) References Cited

U.S. PATENT DOCUMENTS

| | | | | |
|---|---|---|---|---|
| 5,920,522 | A * | 7/1999 | Levanon | G01S 5/28 367/129 |
| 8,102,784 | B1 * | 1/2012 | Lemkin | G01S 5/0289 370/255 |
| 8,918,209 | B2 * | 12/2014 | Rosenstein | G05D 1/0272 700/254 |
| 9,529,082 | B1 * | 12/2016 | Rikoski | G01S 7/52004 |
| 2004/0030500 | A1 * | 2/2004 | Struzinski | G01S 15/66 701/302 |
| 2006/0279454 | A1 * | 12/2006 | Schober | G01S 11/04 342/146 |
| 2008/0008045 | A1 * | 1/2008 | Basilico | G01S 3/8083 367/128 |
| 2008/0165617 | A1 * | 7/2008 | Abbot | G01S 15/876 367/3 |
| 2009/0141587 | A1 * | 6/2009 | Welker | G01V 1/3826 367/16 |
| 2009/0141591 | A1 * | 6/2009 | Basilico | G01S 15/74 367/128 |
| 2010/0039228 | A1 * | 2/2010 | Sadr | G06K 7/10366 340/10.1 |
| 2010/0164781 | A1 * | 7/2010 | Boyer | G01S 5/06 342/165 |
| 2010/0240992 | A1 * | 9/2010 | Hao | A61B 8/585 600/437 |
| 2010/0265128 | A1 * | 10/2010 | Martens | G01S 19/12 342/357.25 |
| 2010/0271615 | A1 * | 10/2010 | Sebastian | G06T 7/246 356/4.01 |
| 2011/0188349 | A1 * | 8/2011 | Basilico | G01S 3/8083 367/118 |
| 2012/0257050 | A1 * | 10/2012 | Simon | G01S 11/12 348/135 |
| 2012/0281503 | A1 * | 11/2012 | Rikoski | G01S 7/52003 367/88 |
| 2014/0029376 | A1 * | 1/2014 | Baliguet | G01V 1/3817 367/13 |
| 2015/0265250 | A1 * | 9/2015 | Madore | A61B 8/5269 600/440 |
| 2016/0332748 | A1 * | 11/2016 | Wang | B64C 39/024 |
| 2017/0343695 | A1 * | 11/2017 | Stetson | G01V 3/14 |
| 2018/0106898 | A1 * | 4/2018 | Baskaran | G01S 7/4802 |
| 2020/0043348 | A1 * | 2/2020 | Ghosh | G01S 13/876 |

OTHER PUBLICATIONS

DARPA Broad Area Announcement (BAA)-15-30, "Positioning System for Deep Ocean Navigation (POSYDON)," Federal Business Opportunities, Apr. 23, 2015.

Rossby, et al., "The RAFOS System," J. Atmospheric and Oceanic Technology, vol. 3, pp. 672-679, Dec. 1986.

Duda, et al., "Evaluation of a Long-Range Joint Acoustic Navigation / Thermometry System," IEEE Oceans 2006, Sep. 18-21, 2006.

Lora Van Uffelen, et al., "Localization and Subsurface Position Error Estimation of Gliders Using Broadband Acoustic Signals at Long Range," IEEE Journal of Oceanic Engineering, 41(3), Jul. 2016, pp. 501-508.

Worcester, et al., "The North Pacific Acoustic Laboratory Deep-Water Acoustic Propagation Experiments in the Philippine Sea," J. Acoust. Soc. Am. 134(4), Pt. 2, Oct. 2013 (17 pp.).

* cited by examiner

DEEP OCEAN LONG RANGE UNDERWATER NAVIGATION ALGORITHM (UNA) FOR DETERMINING THE GEOGRAPHIC POSITION OF UNDERWATER VEHICLES

CROSS REFERENCE TO RELATED APPLICATIONS

The present application claims the benefit of priority to U.S. Provisional Patent Application No. 62/417,738 directed to Deep Ocean Long Range Underwater Navigation Algorithm (UNA) For Determining the Geographic Position of Underwater Vehicles, filed on Nov. 4, 2016, the entirety of which is incorporated herein by reference.

COMPUTER PROGRAM LISTINGS

Computer program listings, Listing A UNA_MAT-LAB_EOC_TraveTime_Detection Program) and Listing B UNA_MATLAB_COLD_START_LEAST_SQUARES_POSITION_PROGRAM), are included herein at the end of the Detailed Description.

BACKGROUND

Field of the Embodiments

The embodiments herein are generally directed to navigation of underwater vehicles and more particularly related to determining the geographic position of an underwater vehicle without requiring prior location information as a reference (i.e. surfacing for a GPS position, and without any information about the ocean sound speed in the area of operation).

Description of Related Art

Improving underwater navigation of undersea vehicles is an ever-evolving field of study and has become increasingly important with the development and expanded use of Autonomous Underwater Vehicles (AUVs), underwater buoyancy gliders, and subsurface scientific floats. Underwater vehicles are critical to defense, scientific ocean research, and deep-sea exploration, e.g., for mining, and oil and gas. Currently, navigation of underwater vehicles relies on GPS (see below) and is carried out over short ranges (approximately 10 km) at specific ocean areas of interest with bottom mounted and ship mounted high frequency (10-100's of kHz) transponders (acoustic beacons), as described in, e.g., J. C. Kinsey et al, A Survey of Underwater Vehicle Navigation: Recent Advances and New Challenges, IFAC Conference of Maneuvering and Control of Marine Craft 88, September 2006. The need for long range underwater navigation in the oceans to basin scales (100-1000's km) was identified by the National Research Council's (NRC) Committee on an Ocean Infrastructure Strategy for U.S. Ocean Research in 2030, Ocean Studies Board, Division on Earth and Life Studies, National Research Council National Academies Press, Jun. 24, 2011. Specifically, the NRC identified the critical infrastructure need for advancements in underwater navigation for more precise and geodetic referenced vehicle locations, and for permanent, large-scale subsurface acoustic positional networks (analogous to GPS) for improved undersea navigation.

In mid-2015, the U.S. Defense Advanced Research Projects Agency (DARPA) requested industry assistance with identifying and developing an undersea system that provides omnipresent, robust positioning. DARPA referred to the program for the to-be-developed system as the Positioning System for Deep Ocean Navigation (POSYDON) program, envisioning that the POSYDON program will distribute a small number of acoustic sources, analogous to GPS satellites, around an ocean basin. In the DARPA Broad Area Announcement (BAA)-15-30 posted in the Federal Business Opportunities website on Apr. 23, 2015 and incorporated herein by reference, DARPA identifies the short-comings of present GPS and other measurement systems. Specifically, while the Global Positioning System (GPS) is the predominant means of obtaining positioning, navigation, and timing (PNT) information for both military and civilian systems and applications, the radio frequency basis for GPS also means that its signals cannot penetrate seawater, and thus undersea GPS is effectively denied. Undersea vehicles use inertial measurement units (IMU) and other dead reckoning sensors to navigate while submerged. Performance of inertial sensors for dead reckoning continue to improve and come in smaller packages. However, while dead reckoning sensors may provide sole-source navigation for short duration missions, accumulation of inertial error eventually requires external measurements to maintain or restore accurate performance. As a result, undersea vehicles must regularly surface to receive GPS signals and fix their position, and this presents a risk of detection. In addition, the cost and power draw of state-of-the art undersea navigation sensors, such as a navigation grade IMU and Doppler velocity log (DVL), are significant ($100's K to $1M).

Data generated from the Philippine Sea 2010 (PhilSea10) Ocean Acoustic Tomography (OAT) experiment has been useful in testing various acoustic positioning and navigation theories, including the embodiments described herein. For the embodiments described herein hydrophones at various depths in a water-column-spanning bottom-mounted Distributed Vertical Line Array (DVLA) are used as a surrogate underwater vehicle for the acoustic positioning as it drifts in a watch circle several hundred meters in diameter. Also, recent work on long range navigation of buoyancy gliders using five PhilSea10 sources as discussed in Lora Van Uffelen et al., IEEE Journal of Oceanic Engineering, 41(3), July 2016, pp 501-508, relies on GPS position obtained by the glider when it is surfaced before diving and then the GPS position after it returns to the surface post-dive. A more detailed description of the PhilSea10 experiment can be found in Worcester et al., "The North Pacific Acoustics Laboratory deep-water acoustic propagation experiments in the Philippine Sea," J. Acoust. Soc. Am. 134 (4), Pt. 2, October 2013 (hereafter Worcester), which is incorporated herein by reference in its entirety.

Similar work in the Arctic Ocean tracking gliders to 100's of km also uses the GPS fixes while the gliders are on the surface as well as computing ranges from known acoustic source positions when the glider is submerged as discussed in Webster et al., Proc. of the IEEE International Conference on Robotics and Automation, May 2015, Seattle, Wash. Both of these prior art efforts, however, do not include the simultaneous least squares estimate of the sound speed in their position/range calculations as discussed with respect to the present embodiments and neither effort has any ground truth of the actual glider position between the GPS positions at pre-dive and at post-dive. Accordingly, actual range and position errors while the glider is submerged are not available.

The current state-of-the-art (SOA) for positioning and tracking of mid-water oceanographic floats called Ranging and Fixing of Sound (RAFOS), is described in Rossby, et al., J. Atmospheric and Oceanic Technology, 1986; with positional accuracy of 1.5-4.5 km as discussed in Duda, et al., IEEE Oceans 2006. Duda describes a proposed RAFOS-2 that would use wider bandwidth signals than are being used in RAFOS (50 Hz, instead of 1.5 Hz) to provide a higher precision time measurement of the complete multipath arrival structure as is done with OAT. It is proposed that these more precise arrival times of all the multipath arrivals can be used as is done with OAT (to develop an accurate ocean model of the 4D sound speed field) that in turn can be used for localization of the floats. Duda speculates that the precision of float position should be 50 m or better. However, Duda does not comment on the accuracy of the position, and there is neither data analyzed nor any algorithm that is discussed to achieve this positioning performance. Of vital importance for the use of the ocean model is some information about the location of the vehicle being navigated to allow any modeled result to be compared to the actual received data. This is the "cold start" problem that the Cold Start Algorithm (CSA) described herein solves.

Accordingly, there clearly remains a continued unmet need in the art for an improved system and/or method for addressing the identified short-comings of known systems and processes in order to provide location and navigational support to undersea vehicles including manned and unmanned vehicles. More particularly, the ability to accurately find the vehicle position from a cold start. i.e., without any prior knowledge or reference about a vehicle's position, would be highly advantageous.

SUMMARY OF THE EMBODIMENTS

In a first exemplary embodiment, a process for determining a location of an underwater vehicle without prior location or any ocean sound speed information for the underwater vehicle includes: receiving, at a receiver hydrophone located on the underwater vehicle, acoustic signals from a predetermined number of acoustic sources at known locations; determining, by an onboard processor, an end of the Coda (EOC) travel time for each of the received acoustic signals from each of the sources; and applying, by the onboard processor, iterative linearized least squares estimation to the determined EOC travel times for each of the received acoustic source signals to simultaneously determine absolute x, y, coordinates and c, wherein x is latitude, y is longitude, z is depth and c is ocean sound speed; wherein the values for x, y, and c are the values that minimize the sum of squared errors of ranges from each of the known acoustic sources' positions to the computed underwater vehicle CSA position including determined absolute x, y and z, and further wherein the value for z is known using a pressure sensor in the vehicle.

In a second exemplary embodiment, a computer readable storage medium having data stored therein representing software executable by a computer, includes software instructions to determine a location of an underwater vehicle without prior location or any ocean sound speed information for the underwater vehicle as follows: instructions for processing acoustic signals, arriving at the underwater vehicle, from a predetermined number of acoustic sources at known locations; instructions for determining an end of the Coda (EOC) travel time for each of the received acoustic signals from each of the sources; and instructions for applying iterative linearized least squares estimation to the determined EOC travel times for each of the received acoustic source signals to simultaneously determine absolute x, y, coordinates and c, wherein x is latitude, y is longitude, z is depth and c is ocean sound speed; further wherein the values for x, y, and c are the values that minimize the sum of squared errors of ranges from each of the known acoustic sources' positions to the computed underwater vehicle CSA position including determined absolute x, y and z, and further wherein the value for z is known using a pressure sensor in the vehicle.

A third exemplary embodiment is a system for determining a location of an underwater vehicle without prior location or any ocean sound speed information for the underwater vehicle including: at least one receiver hydrophone located on the underwater vehicle for receiving acoustic signals from a predetermined number of acoustic sources at known locations; and a specifically programmed processor, programmed with instructions to: determine an end of the Coda (EOC) travel time for each of the received acoustic signals from each of the predetermined number of acoustic sources at known locations; and apply iterative linearized least squares estimation to the determined EOC travel times for each of the received acoustic source signals to simultaneously determine absolute x, y, coordinates and c, wherein x is latitude, y is longitude, z is depth and c is ocean sound speed, wherein a values for x, y, and c are the values that minimize the sum of squared errors of ranges from each of the known acoustic sources' positions to the computed underwater vehicle CSA position including determined absolute x, y and z, and further wherein the value for z is known using a pressure sensor in the vehicle.

SUMMARY OF THE FIGURES

The patent or application file contains at least one drawing executed in color. Copies of this patent or patent application publication with color drawing(s) will be provided by the Office upon request and payment of the necessary fee.

The following figures are intended to be part of the description of the embodiments herein and considered when reading the Detailed Description herein.

DETAILED DESCRIPTION

Figure 1:
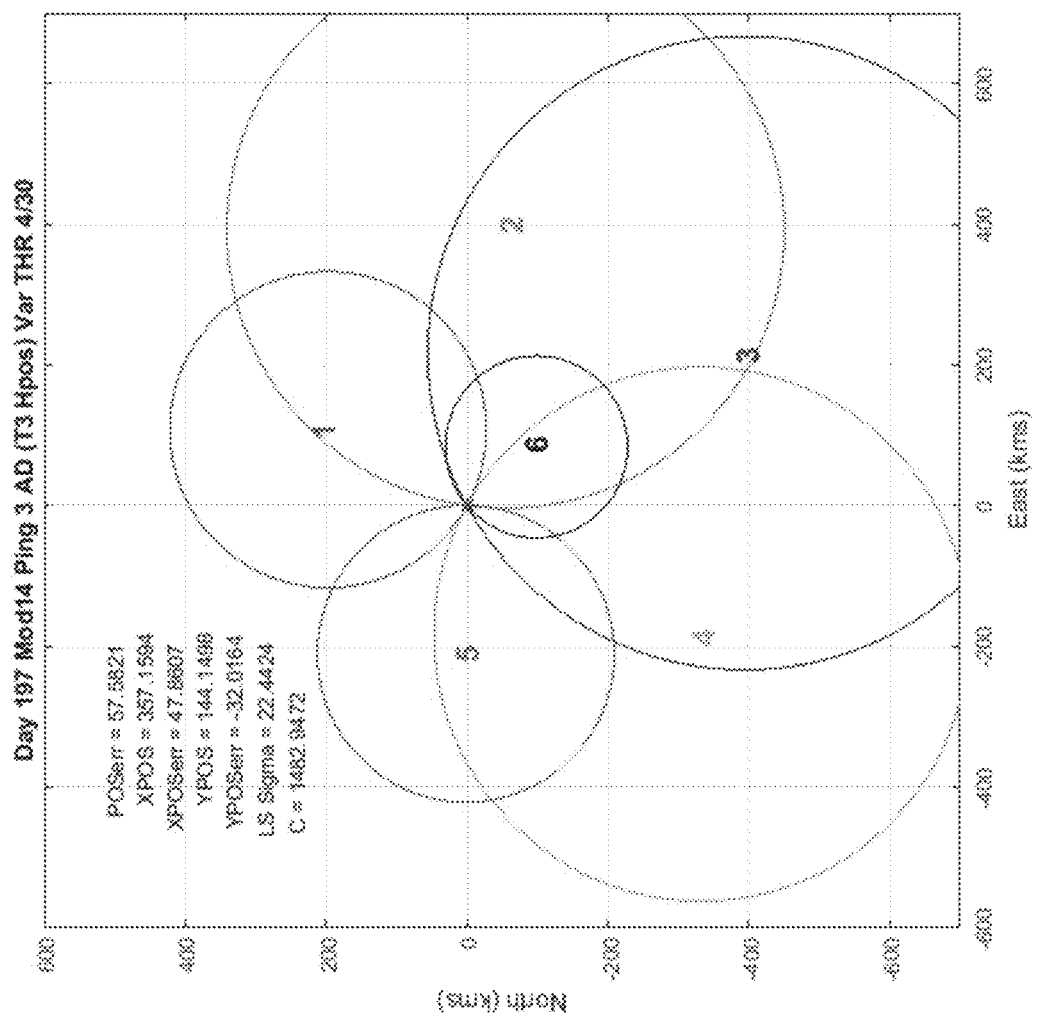
FIG. 1 is a first view of the CSA cold start position of a hydrophone module for a specific transmission sequence showing the positions of the six moored sources of the PhilSea10 experiment and the ranges obtained by the CSA algorithm in accordance with embodied results of the UNA algorithm described herein.

The present embodiments describe an underwater navigation algorithm (UNA) which uses acoustic signals transmitted in the ocean from sources at known positions (similar to satellites in GPS) to compute a position underwater that requires no initial a priori position or ocean sound speed information or any initial GPS position that would require surfacing. In general for a navigation system installed in the ocean the sources should be in widely separated arrangements similar to that shown in FIG. 1, that is typical of Ocean Acoustic Tomography (OAT) experiments that will provide good geometry (low dilution of precision) for navigation. The UNA consists of two parts, (1) the Cold Start Algorithm (CSA) (Listing A and B) and (2) the CSA with Modeling (CSAM). The CSA is the major innovation for underwater navigation that calculates the underwater vehicle geographic position. The underwater vehicle needs to be equipped with only a single hydrophone acoustic receiver and an onboard processor to calculate onboard the CSA position. The CSA requires only measuring the travel time of the end of the arrival coda from each of the sources to compute a position. The CSAM is a post CSA procedure to improve the CSA position accuracy. CSAM consists of Procedure (1): a tested procedure involving acoustic propagation modeling called "bulk shifting", Procedure (2): a new proposed procedure based on recent analysis illustrated in FIG. 6, using the acoustic group speeds as described below, and (3): several additional possible applications that are discussed below. All of these CSAM procedures require the computed CSA position and a 4D sound speed field derived from an ocean 4D General Circulation Model (GCM) constrained using Ocean Acoustic Tomography (OAT) in the ocean area of operation. The 4D GCM's such as the Naval Research Laboratory (NRL) Hybrid Coordinate Model (HY-COM) are run in real time at shore facilities like the Naval Meteorology and Oceanography Command (NMOC), Stennis Space Center, MS.

CSA uses a measured travel time (Listing A) from each source in a linearized least squares algorithm (Listing B) that solves for the absolute x and y (or latitude and longitude) position coordinates (z or depth is known with a pressure sensor) and the ocean sound speed "c". The algorithm is based on the standard linearized range-only least squares equation for determining position that is identical to the computation of receiver position using pseudoranges in GPS as described in, e.g., Borre and Strang, Algorithms for Global Position, Wellesley-Cambridge Press, 2012 which is incorporated herein by reference, with the critical modification for the underwater sound application to include the speed of sound as one of the unknowns. There are three unknowns so mathematically a minimum of 3 sources is required. For practical applications given errors in travel time measurement and geometric dilution of precision issues it is important to have multiple sources greater than the number of unknowns. In a preferred embodiment, there are nominally five to six for an ocean area of order ½-1 million square kilometers. In PhilSea10 there were 6 sources. Including "c" as an unknown is counterintuitive as this assumes that c(x,y,z,t) is the same for all sources to the receiver which is clearly not true in the ocean. The question, however, is how large is the difference from source to source and is this difference large enough to make this assumption invalid. The results with ocean data from the PhilSea10 experiment for 382 calculated navigation positions for 20 days from Apr. 25, 2010 through Mar. 11, 2011 show that the differences are not so great, and make this assumption of practical value demonstrated by the position accuracy achieved to date of 57 m mean error with a standard deviation of 31 m that is 30 to 80 times better that the state-of-the art discussed above.

Including the sound speed as an unknown in the least squares solution does not work unless the travel time of the multipath/multimode arrival structure is measured at the end of the arrival structure. It is the combination of measuring with high precision the end of the Coda (EOC) or crescendo travel time with the least squares estimation of "c" that is the essential innovation that has not been done before for navigation with multiple sources. It is well known that these last arrivals are somewhat more stable as they are associated with energy that travels deeper in the ocean close to the sound channel axis which is at approximately 1000 m depth for the PhilSea10 location, where there is less oceanographic variability from internal waves both spatially and temporally. In the present embodiments the use of "c" as an unknown in the least square estimation is combined with a time measurement of the deeper acoustic energy received (the EOC) thus minimizing the "c" spatial and time variability between each of the source receiver paths and from transmission to transmission in time.

The CSA computed "c" is typically within several tenths of a meter/sec or better of the calculated group velocity from the ocean acoustic tomography constrained ocean GCM from PhilSea10. This confirms that the CSA is computing the group speeds of the last arrivals (the measured EOC travel times) that are in fact the group speeds for the turning depths of the modes at the depth of the hydrophone and as such is firmly grounded in the physics of underwater acoustic propagation (see FIG. 6). The average group velocities from the OAT constrained PhilSea10 4D sound speed at the depths of the EOC arrivals varies from each of the sources to the receiver by several tenths of a meter/sec or equivalently several 20's of meters of range variation when multiplied by the source to receiver travel times which is consistent with the CSA performance and supports the validity of this claim.

Two MATLAB computer programs provided herein exemplify and implement the processes discussed herein to (a) automatically detect the end of the multipath/multimode acoustic signal (EOC travel time detection program) (Listing A) and (b) compute the CSA least squares position (Listing B). The EOC travel time detection program uses a variable threshold that is a function of the measured noise level, the maximum measured signal to noise ratio, and the signal duration that is a function of the measured average travel time of the received acoustic signal. This automated EOC travel time detection code is itself a novel embodiment that is not based on any previous known work and is integral to the performance of the CSA. The input to the EOC travel time program is the pulse compressed time series of the received source signal. The EOC travel times from each of the sources are then input into the CSA position program (CSA) that uses iterative linearized least squares estimation to find the absolute x, y, coordinates and c that minimizes the sum of the squared errors of the ranges from each of the sources to the computed CSA position.

The CSAM Procedure (1) uses the 4D sound speed field (described herein) and an acoustic propagation modeling code (that is available off-the-shelf) to compute a modeled arrival result from each known source location to the CSA computed position. The modeled result (the modeled acoustic arrival structure) is compared with the received acoustic arrival structure (See FIG. 4 for an example of the received acoustic data arrival). The modeled acoustic arrivals from each source are shifted in time to match the received data from each source, and the resulting time/distance offsets for projections from each source from the CSA position are used to compute a new least squares position. This is called bulk-shifting and is a well-known procedure; however, it is the CSA position that insures the modeled result is sufficiently close to the actual position that the correlation with the data is high and the time offset more accurate. The improvement of the position from the initial CSA position does depend on the accuracy of the 4D sound speed field. An analysis of 8 CSAM positions with the PhilSea10 OAT constrained GCM 4D sound speed field reduced the mean position error from 63 m to 40 m.

The CSAM Procedure (2) takes advantage of the CSA position but does not involve using an acoustic propagation code to produce a modeled arrival structure. It uses the calculated group speed directly from the 4D ocean model. With the initial position in the ocean provided by the CSA the group speeds from each source to the CSA position is calculated permitting using the source specific group speeds correcting for the difference from the single CSA sound speed that is used for all six sources. While not tested yet, given the fact that this procedure attempts to correct the single sound speed assumption of the CSA, it is expected that this will provide a more accurate position estimate than the CSA. The quantitative improvement would depend on the accuracy of the 4D sound speed field produced for the OAT constrained ocean GCM. There is no known existing description or application of this procedure for underwater positioning. Other CSAM procedures involve using modeled results for single ray identification and tracking, multiple rays and modes as well as other methods of ray/mode tracking from transmission to transmission in time and from source to source to improve position accuracy. We expect these methods enabled by the CSA position will improve the performance numbers achieved to date and provide further improvement when combined in a Kalman filter with vehicle dynamics and inertial navigation system (INS).

The UNA CSA provides a completely independent position estimate and does not rely on any previous vehicle state estimate (x,y,z,vx,vy,vz,t). The UNA can be implemented in a Kalman filter with vehicle dynamics, and onboard INS, to develop a vehicle track that will improve performance. Should there be loss of track due to propagation drop outs, noise, hardware problems, etc. the CSA can restart the tracking processing after the next successfully received set of source transmissions immediately. There is no requirement for the vehicle to have to surface for a GPS reset. Higher source transmission pulse repetition rates (PRI's) of minutes or less rather than hours (as in PhilSea10) are required for robust ray tracking, pulse to pulse processing such as averaging and differencing, the former for mitigating ray path fading, and resolving phase cycle ambiguities, and the later to extract propagation effects (similar to GPS processing) and improve pulse to pulse range deltas from each source. Higher PRI's will cause overlap of signals from different sources arriving at the receiver. For continuous wave (CW) transmissions, frequency and time diversity can be used. For spread spectrum signals, depending on bandwidths and center frequencies, time and frequency diversity may be possible, as well as using orthogonal encoded waveforms.

CSA relies on travel time measurements to compute estimates of absolute ranges to generate positions. In GPS, the highly accurate position estimates are generated by tracking carrier phase. This requires resolving the phase ambiguity (sometimes referred to as cycle or lane ambiguities) of multiple unknown cycles along a propagation path from the source to the receiver. The UNA provides a position estimate of sufficient accuracy that it could be capable of resolving the phase ambiguity and enable ranging and tracking with phase and phase rate.

The CSA has demonstrated positioning with an accuracy of 57 m mean position error (maximum error of 156 m and minimum error of 1 m) with a standard deviation of 31 m for 382 CSA computed positions using data from 20 days of the PhilSea10 experiment from April, 2010 thru March, 2011 using six acoustic sources at ranges of 129-450 km from the hydrophone receiver being navigated. The hydrophone receivers were tracked with a bottom mounted transponder system with nominally 1 m position accuracy (as described in Worcester et al.) and this provided the ground truth for comparison with the CSA positions. In addition to the analysis of the position errors, analysis of the CSA range errors has also been calculated for the 382 total positions with 2,220 computed CSA ranges. The 2,220 range errors of the CSA positions are Gaussian distributed with ~zero mean ($-1.8$ m) and a standard deviation of 46 m (see FIG. 5$e$). Of significant interest is that this standard deviation is approximately the same for all six sources (see FIG. 5$f$). Since the source ranges are 129 km to 450 km there is an implication that the CSA range errors could be range independent such that the positioning results achieved with the PhilSea10 data set could apply to results with significantly longer ranges than 450 km. Thus covering larger ocean areas with the same number of 5-6 sources might be possible. In summary the UNA requires multiple sources nominally 5-6, installed in the ocean area of operation (actual source placement and number would be site specific and area coverage specific), broadband waveforms (50-100 Hz) and received signal-to-noise ratio (SNR) sufficient for travel time measurement with milliseconds precision.

The CSA performance is 30 to 80 times better than the current SOA, i.e., RAFOS, for positioning and tracking of mid-water oceanographic floats.

More particularly, using data from PhilSea10 (Worcester), FIG. 1 is an expanded view (1,100 km×1,100 km) of the Cold Start Position of hydrophone module 14 on Jul. 16, 2010 for the third transmission sequence (Ping 3) starting at 0600Z. The numbers show the positions of the sources of the PhilSea10 experiment and the respective rings are the ranges obtained by the CSA algorithm with the end of the Coda (EOC) travel times measured by the CSA travel time program (Listing A) multiplied by the best fit "c" that is shown in the legend in the upper left of the FIG. 1. The range rings all appear to cross at the x=0 and y=0 coordinate which is the anchor position of the Digital Vertical Line Array (DVLA) of hydrophones moored to the bottom with 150 hydrophones extending from a depth of 5381 m to 180 m that drifted in a tidal forced watch circle of several hundred meters and were used to test the CSA. In this example hydrophone module 14 was used at 540 m depth. All of the hydrophone modules in the array were tracked hourly by 4 bottom moored transponders that provided the ground truth for the CSA positions.

Figure 2:
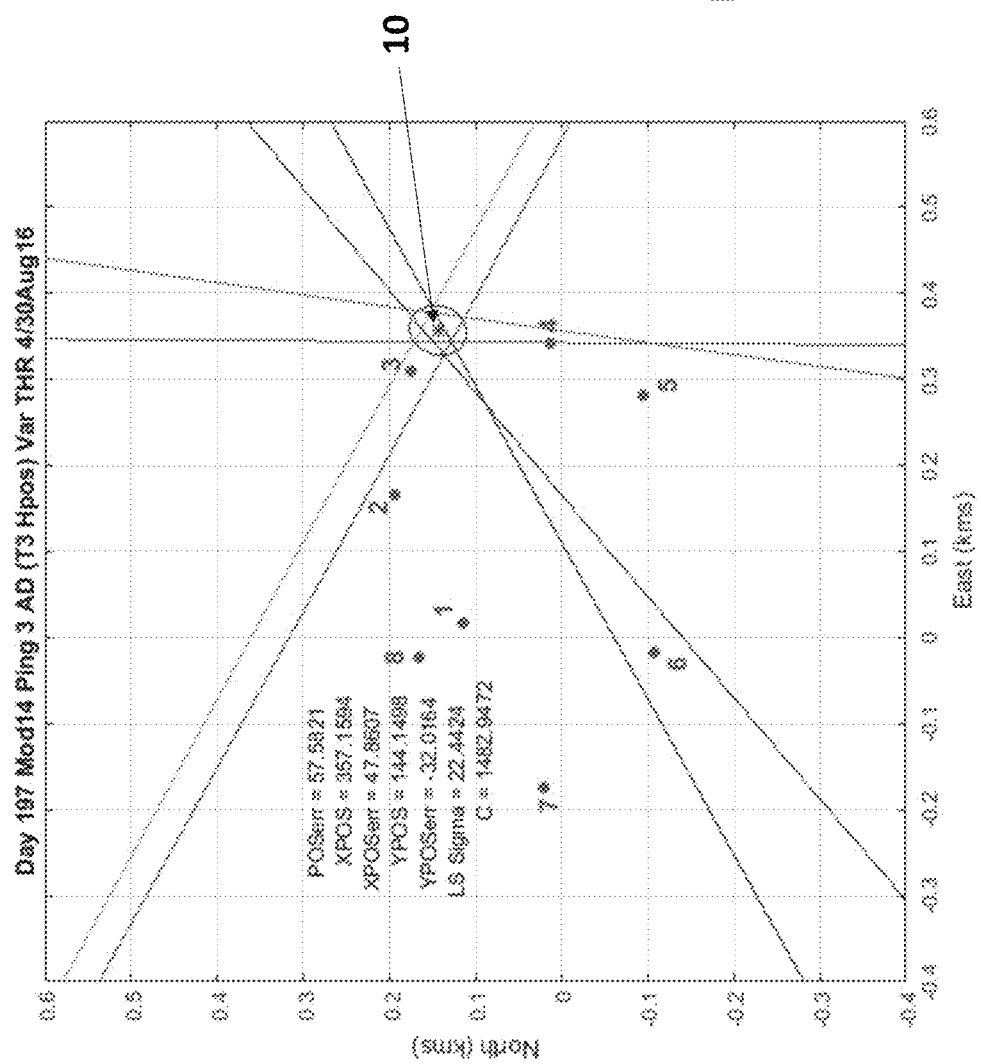
FIG. 2 is a blow up view of FIG. 1 and includes ground truth mapping corresponding to the eight transmissions sequences per day denoted "ping" numbers 1-8 in accordance with the embodied results of the UNA algorithm described herein.

FIG. 2 is a reduction of FIG. 1 down to a scale of 1 km×1 km, and shows the crossing ranges from the sources, the CSA least squares position for Ping 3, the (*) noted 10, and the ground truth shown as dots with corresponding Ping numbers (transmission sequences) 1-8 noted. During a 24-hour period the 6 sources transmitted every 3 hours starting at 0000Z,Ping 1 and around the watch circle to Ping 8 at 2100Z. The "POSerr" in FIG. 1 of 57.58 m is the straight line separation from the ground truth (dot number 3) and the CSA position (astrix noted 10). When a transmission sequence started source 1 transmitted first and then each source in turn at 9-minute intervals with source 6 transmitting at 45 mins past the hour. Since the CSA uses all six ranges from the six sources it takes approximately 47 mins to receive all the data needed to compute the position. As can be seen from the ground truth tracks the hydrophone can travel as much as 100 m during this time and this is a source of error for the CSA which can be eliminated with a shorter source transmission intervals and orthogonal spread spectrum waveforms to mitigate the overlap of arriving signals from different sources. This would be expected to reduce the errors calculated and reported herein.

Figure 3:
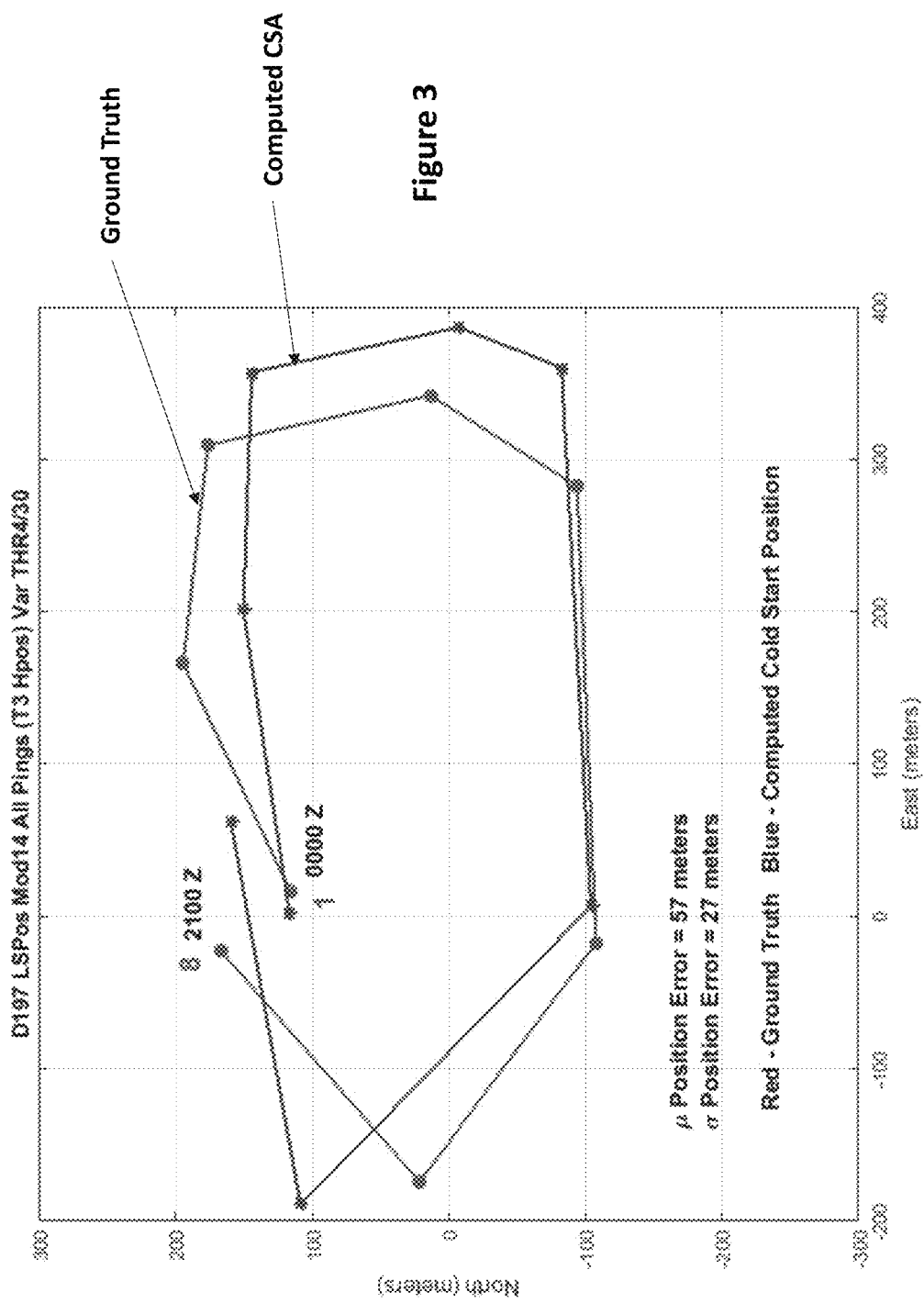
FIG. 3 is a comparison between ground truth of the 8 pings to the computed position for each of the 8 pings using CSA in accordance with the embodied results of the UNA algorithm described herein.

In FIG. 3, the CSA position has been computed for all Pings 1-8 from 0000Z to 2100Z for Jul. 16, 2010. As in FIG. 2 the ground truth are the eight dots with the CSA positions noted by the astrix's. The mean of these 8 position errors is 57 m and the standard deviation is 27. From the 20 days of data from the PhilSea10 experiment 48 of these tracks were computed. All but one track has 8 CSA positions (the one that didn't had 6, as high noise blanked out two of the transmission sequences) for a total of 382 positions. The mean error for all 382 positions was 57 m and the standard deviation was 31 m.

Figure 4:
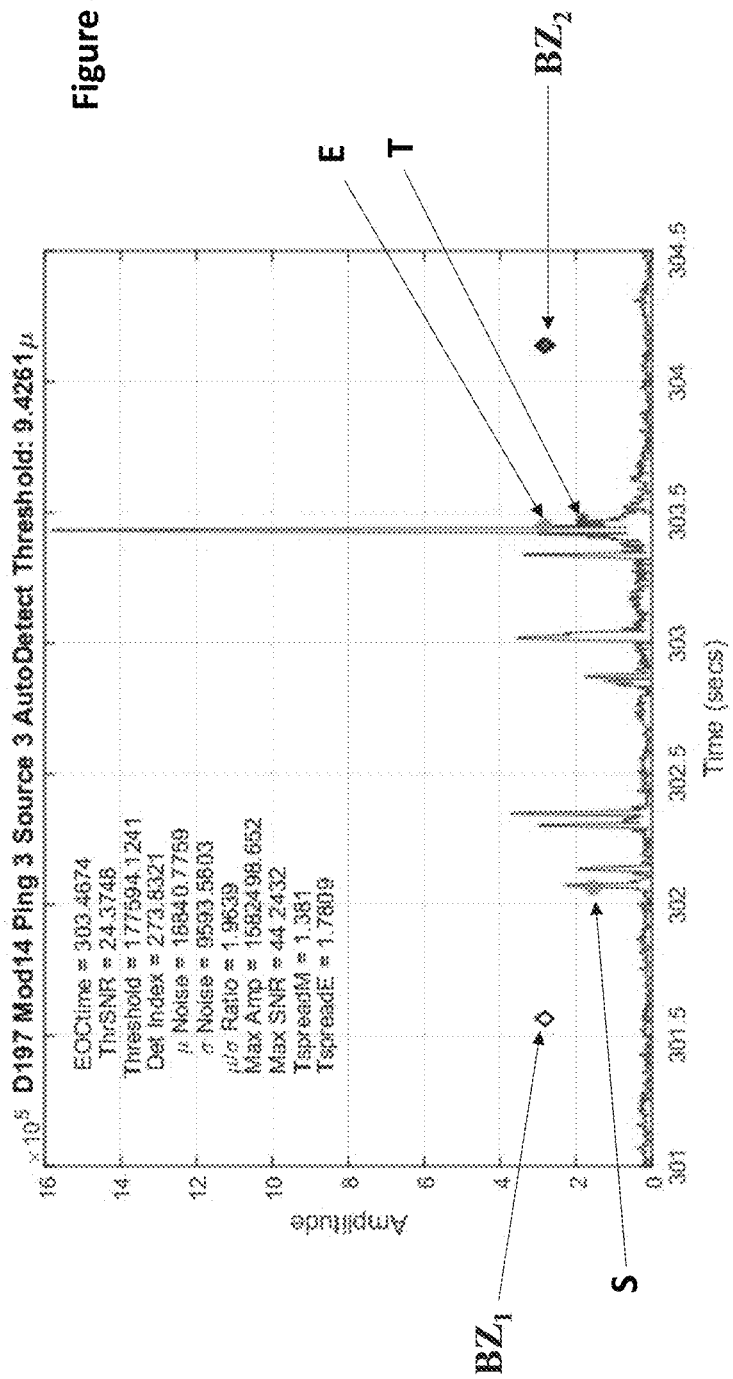
FIG. 4 is the received arrival waveform from source 3 to hydrophone module 14 including the "UNA_MATLAB_EOC_TravelTime_Detection Program" (Listing A) detection of the approximate start S and end E of the signal and the EOC travel time (T) in accordance with embodied results of the UNA algorithm described herein.

FIG. 4 is the received acoustic arrival waveform/structure from source 3 to hydrophone module 14 at approximately 540 m deep and approximately 450 km range transmitted on Jul. 16, 2010 at 0618 GMT. The peaks are the ray paths arriving from the source at the receive hydrophone. This multipath/multimode arrival coda is typical for long range deep sound channel propagation in the ocean. The early arrivals are those rays with upper turning depths that are shallow (approximately 100's m) and lower turning depths that are deep (>1000 m), while the last arrivals are those that travel close to the sound channel axis which is at approximately 1000 m depth for the location of the PhilSea10 experiment. The time scale is in seconds from the start of the transmission. The UNA_MATLAB_EOC_TravelTime_Detection Program" (Listing A) detects the approximate start S and end E of the signal and the EOC travel time (T) which for this case is 303.47 secs indicated in the legend of FIG. 4. A buffer zone is established around the arrival signal ($BZ_1$, $BZ_2$). Noise mean and variance are measured before $BZ_1$ The UNA_MATLAB_EOC_TravelTime_Detection Program" (Listing A) detects the EOC travel time for sources 1 thru 6 for each transmission sequence that are then input into the UNA_MATLAB_COLD_START_LEAST_SQUARES_POSITION_PROGRAM (Listing B). Source 6 failed on Nov. 1, 2010 so only the remaining 5 were used after that date. A total of 2,220 plots/output, like the above, have been generated to compute the ranges used for the 382 CSA positions from the PhilSea10 experiment.

Figure 5A:
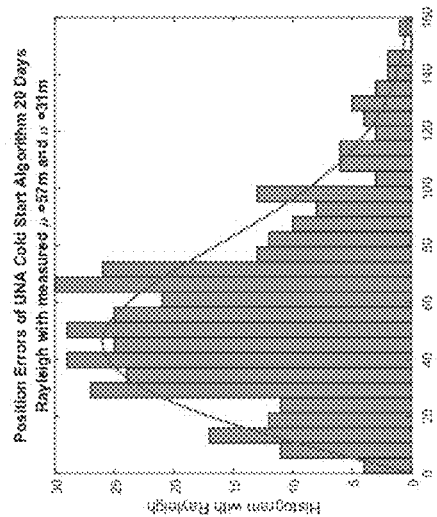
FIGS. 5a-5f chart CSA position and range errors in accordance with the embodied results of the UNA algorithm described herein.
Figure 5B:
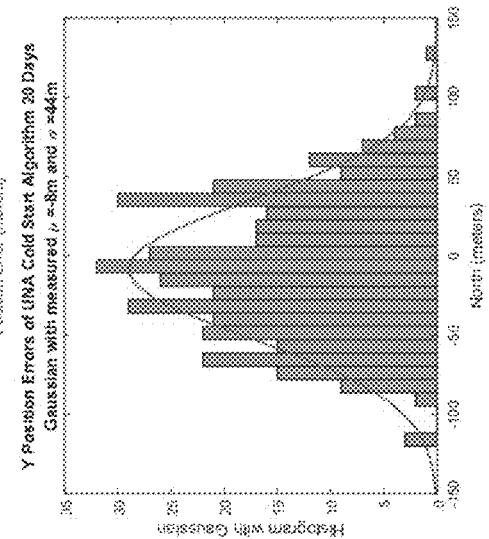
Figure 5C:
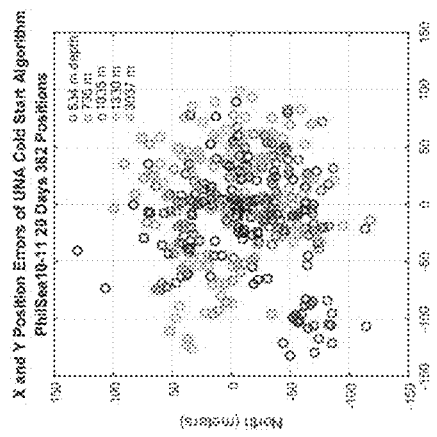
Figure 5D:
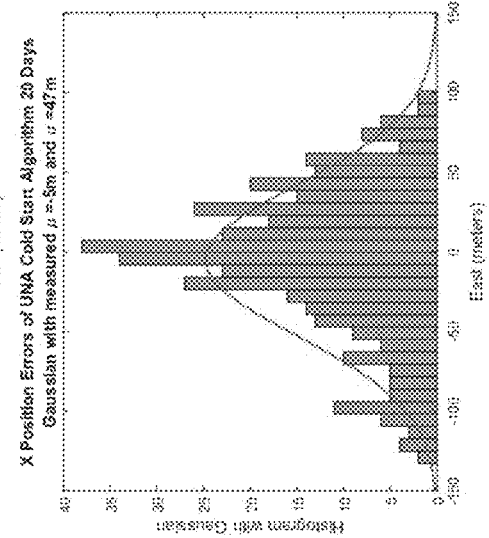
Figure 5F:
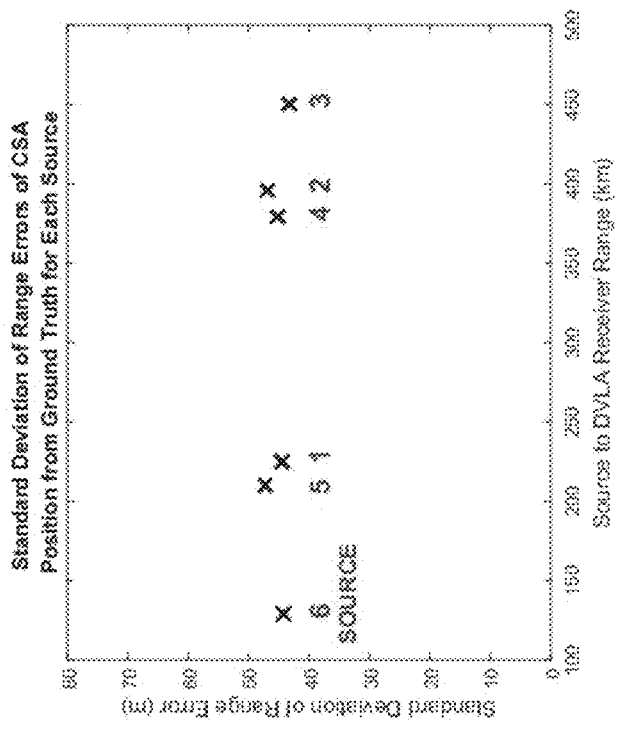
Figure 5E:
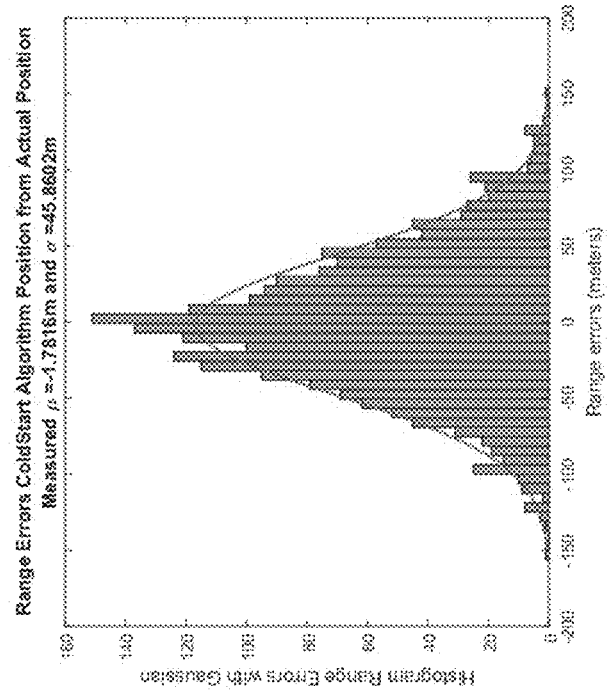

Per the discussion above, the UNA Cold Start Algorithm (CSA) was used to calculate the position of drifting hydrophones in a water column spanning vertical line array in the PhilSea10 experiment. Data from 20 days spanning Apr. 25, 2010 through Mar. 11, 2011 was used and 382 positions were calculated. The array hydrophones were tracked with a bottom mounted transponder grid to an accuracy of 1 m. This was used as the ground truth for calculating the position errors with the CSA. The error of the CSA position is the offset in meters from the ground truth position. FIG. 5a shows the X coordinate and Y coordinate errors in a scatter plot. The color codes the depth of the hydrophone that was tracked with the CSA. There is no depth dependence apparent in the CSA performance. The histograms of FIGS. 5c and 5d show the X and Y coordinate errors and are reasonably characterized by Gaussian densities the position error is the square root of $(X^2+Y^2)$ and therefore should be Rayleigh distributed. FIG. 5b is the histogram of the position error in meters with the calculated Rayleigh density using the measured data mean (57 m) and standard deviation (31 m) of all of the 382 CSA positions. The maximum position error was 156 m and the minimum position error was 1 m. The histogram of FIG. 5e shows the range errors between the CSA computed position and ground truth. The range errors are Gaussian distributed with a zero mean and a standard deviation of 46 m. The range errors were also computed from each source as shown in FIG. 5f.

Figure 6:
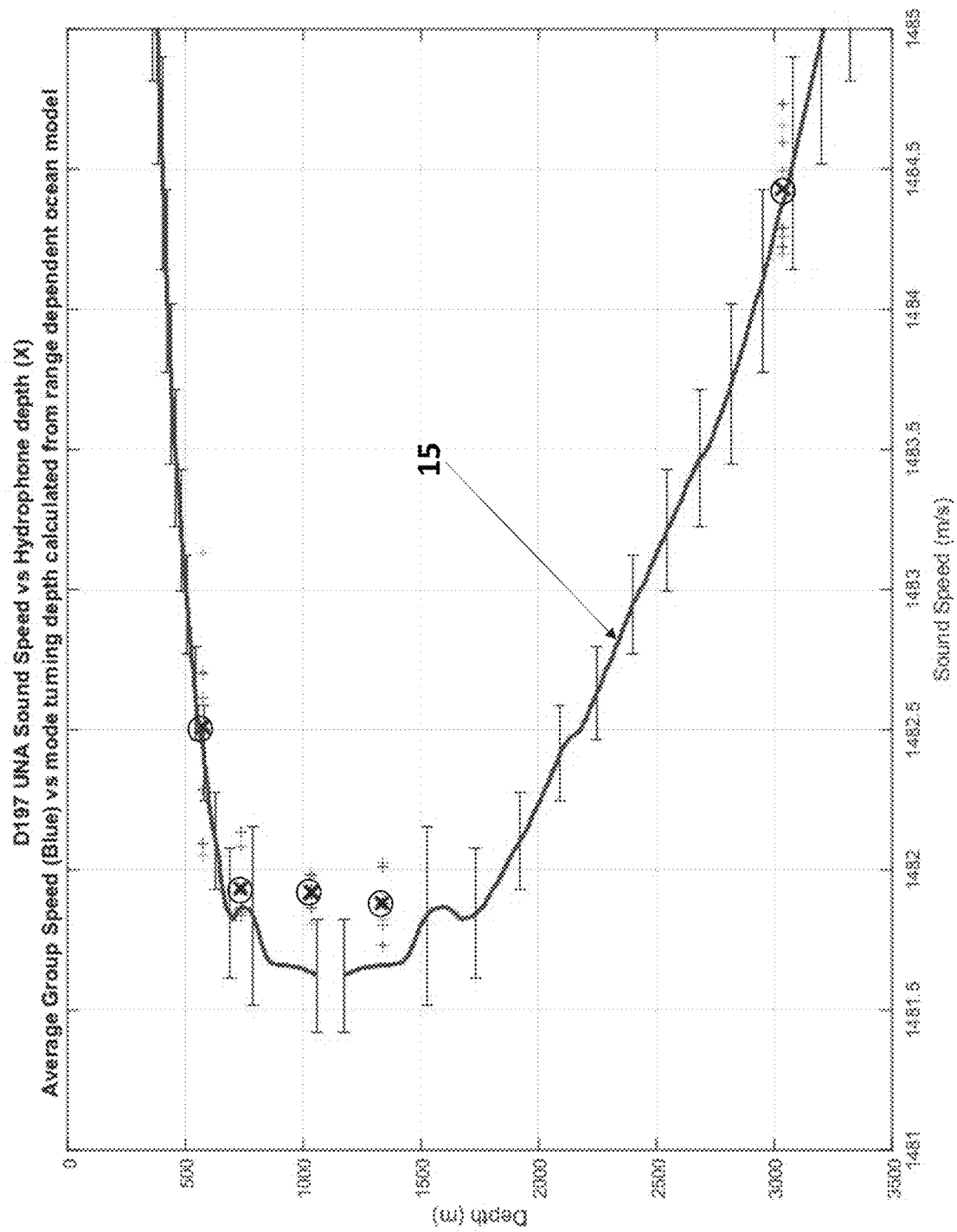
FIG. 6 shows CSA computed sound speed for May 3, 2010 (Day 123) at six hydrophone depths on the Distributed Vertical Line Array (DVLA) used to illustrate the embodied results of the UNA algorithm described herein.

In FIG. 6, the computed sound speed for Jul. 16, 2010 (Day 197) at hydrophone depths of 540, 740, 1040, 1340, and 3040 m on the Distributed Vertical Line Array (DVLA) is marked with the circled x's which is the average sound speed of the 8 sound speeds (and positions) that were computed at each depth. The small crosses (+) are the CSA sound speeds for each of the 8 computed positions for each depth. The calculated average Group Speed (Cg) as a function of mode turning depth in meters from the PhilSea10 experiment 4D GCM constrained by ocean acoustic tomography is shown as line 15. The average Cg is computed first along the range dependent path from each of the 6 sources to the DVLA and then the 6 sources' Cg's are averaged to obtain the line 15. The error bars represent one sigma of the variability from source to source in the average. This graphic shows that the sound speeds computed by the CSA are in fact the average group speeds of the modes that turn at the depth of the hydrophone, when the travel time is measured at the end of the coda, in accordance with acoustic propagation physics. Similar results have been obtained for Days 123, and 191. The calculation of Cg was done with adiabatic modes. There is very new theoretical research from propagation modeling of low order modes in the range dependent deep sound channel typical of the oceans, that mode coupling from higher faster modes into the lower modes near the axis is in fact occurring. This results in lower modes arriving faster than predicted by an adiabatic (no coupling) assumption. As shown in FIG. 6 for Day 197 (and also for Days 123 and 191 not shown) the CSA computed sound speeds are in fact faster than the computed Cg with the adiabatic assumption. Since the CSA is processing actual low mode propagation data this is possibly the first experimental measurement of this deep ocean coupling phenomenon. These results show that the CSA is in fact computing the average group speed that (1), is consistent with fundamental ocean acoustic propagation physics and (2), informs the new CSAM Procedure 2, such that group speeds can be calculated directly from the 4D GCM OAT constrained models to potentially provide a more accurate position.

Figure 7:
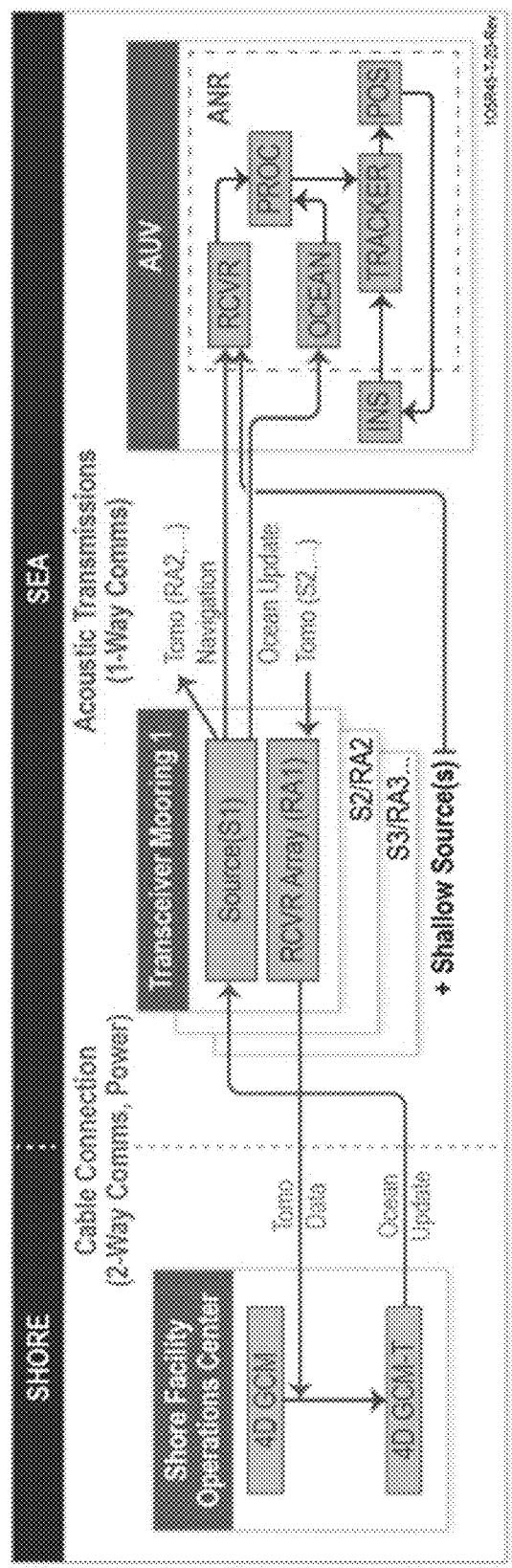
FIG. 7 is an exemplary system including various subsystems and components, one or more of which may be used to implement one or more of the embodiments described herein.

FIG. 7 illustrate an exemplary system for implementing one or more of the embodiments described herein. The three major subsystems include a shore facility, the multiple sources (moored acoustic transceivers), and the underwater vehicle, e.g., AUV. Each source (S1, . . . ) in the configuration continually broadcasts acoustic signals (pings) with a time duration (T) and bandwidth (BW) on a ping repetition interval (PRI>T). The receiver hardware on the AUV is a single hydrophone, which may be collocated with a single tri-axial vector-sensor, that receives the acoustic source signals. The AUV processor measures the signals' travel times, phases, and phase rates (Doppler) and converts these measurements into estimated ranges, delta ranges, and range rates from each source as described herein. These estimates may be further processed with onboard INS data, onboard pressure-sensor depth, and VLF data when available, in a tracker to continuously update the AUV three-dimensional (3D) position and velocity. Each source's acoustic signals may also be received by small vertical line arrays (VLA) (RA1, . . . ) located above each of the other deep sources. These signals may be used for ocean acoustic tomography (OAT), which improves estimated range accuracy by improving 4D SSF accuracy as discussed herein. The 4D SSF may be computed from a real-time 4D ocean general circulation model (GCM) (4D GCM). The 4D ocean GCM constrained by the tomography data (4D GCM-T) and the resulting 4D SSF may be computed and parametrized at shore facilities. To maintain ranging accuracy during extended periods of underwater operations, parameters to update the 4D SSF may be sent to the sources and broadcast to the AUV with acoustic communications. Extended undersea operations for AUV's will also require a highly accurate low power clock on board the vehicle (to several millisecs over the total time submerged). Technology such as Chip Scale Atomic Clocks (CSAC) are advancing very rapidly, and current clock technology can easily provide the accuracy needed for AUV operations over the typical endurance of such vehicles today (days). Both AUV endurance and accurate low power clocks are areas of rapidly developing technology. One skilled in the art will appreciate that the system of FIG. 7 is purely exemplary and not all subsystems or components are required for all embodiments. In particular the CSA does not require the shore facility 4D ocean model, acoustic tomography, or the acoustic communications.

Accordingly, the present embodiments describe a system and process for computing the determining the geographic position of an underwater vehicle without requiring prior location information of the vehicle or any sound speed or ocean information in order to provide a position as demonstrated with data within a 500,000 square kilometer ocean area in the Philippine Sea to 57 m mean location accuracy with a maximum error of 156 m, that in turn enables additional procedures for more accurate positioning. All references cited herein are considered to be within the skill in the art and are incorporated herein by reference. The process as applied to the PhilSea10 data is in no way intended to be limiting, but is merely intended to exemplify the enablement of the process. The Philippine Sea is one of the most variable ocean areas for mesoscale oceanography in the world and challenging for long range navigation. One skilled in the art will appreciate variations to parameters that are well within the scope of the present embodiments.

```
% Automated EOC (End Of CODA) edge detect program with noise est. and CODA
% time spread estimate for EOC threshold detect. Variable threshold based
% on noise mean and variance and maximum SNR in arrival CODA
% Author Peter Mikhalevaky
% Date: Oct. 10, 2015 - original version
% Updated/modified through Aug. 2016
% Date: March 22, 2017 - modify code to read the dmodx files from Scripps
% provided by Matt Dzieciuch and improve formula using SNR calculations for
% variable threshold settings.
% July, 2017, modified code to read dmodz files from Matt that include both
% dm.dmodx files with only clock corrections and source delay corrections
% and dm.dmod files that have all the corrections.
% Load the Dzieciuch pulse compressed matched filtered complex time series
% data file. Each of the Dzieciuch processed time series are ~20 secs long
% at 1.0 msec sample rate with ~20,000 samples for each source transmission
% record.
% Threshold number (THR) is used to set EOCfinal threshold at THR*NoiseMean
% in amplitude. SNR = 20 log ((THR*NM - NM)/SN) = 20 log ((THR-1)*NM/SN)
% For noise amplitude the pdf is Rayleigh and NM ~ 1.913 * SM
% Use variable threshold based on maximum SNR ray path arrival in CODA
% Thresholds based on mutliples of amplitude NoiseMean are used for the
% start and end of the CODA and the final estimate of the EOC time.
clear all
% Enter Julian Day of data from PhilSea10
% Days available are 115 + 8n (n = 0,1,...,41) and 191, 193, 197, 199, 449
% Days after 365 are Julian Day for 2011 (+ 365)
jd = 197;
% Implementing very simple tracking for the small number of very high noise
% cases from the PhilSea 10 data set when F * NoiseMean is greater than
% the Max SNR, but there is a maximum peak within an
% arrival time window for each source based on tracking rays from
% previous pings. In this case the window is very large at 2 secs. This
% allows credible high level single arrivals to be used. For a nav system
% we would design for high SNR at all receiver locations like GPS within
% the operational area such that this is not needed. This allows us to
% still use some very low SNR detected signals from PhilSea10
LB(1) = 150;
UB(1) = 152;
LB(2) = 266;
UB(2) = 268;
LB(3) = 302;
UB(3) = 304;
LB(4) = 255;
UB(4) = 257;
LB(5) = 141;
UB(5) = 143;
LB(6) = 86;
UB(6) = 88;
```

```
Mods = 10; % Hydrophone module index number 1 - 149
Mod = 15; % Hydrophone module number
Pend = 8; % Total number of 'Pings' per transmission day. One Ping consists
          % of receptions from all 6 sources, or 5 sources after day 305.
MST = 38; % SNR for EOC detection of PhilSea10 CODA to adjust threshold to
          % minimize capture of spurious peaks or side lobes of the pulse
          % compression. For Max SNR > MST the threshold gets adjusted up.
F = 5; % The threshold floor is F * NoiseMean in amplitude ~ Rayleigh pdf
       % and NoiseMean = 1.913 NoiseSig
       % The SNR of the floor is 20 log ((F-1) * 1.913), 1.7 dB for F=5,
       % 15.2 dB for F=4 and 11.7dB for F = 3
for P = 1 %2:8 % Ping number 1 - 8 (0000Z, 0300Z,..., 2100Z)
for T = 2:6 %Source number
% Set up filename for SIO dmod/dmodz pulse compressed data .mat file
p = cellstr(['00';'03';'06';'09';'12';'15';'18';'21']);
t = cellstr(['0020';'1316';'2252';'3105';'3811';'4616']);
siodmod = ['dm' num2str(jd) p{P} t{T} '.mat'];
load(['C:\Users\mikhalevskyp\Desktop\All_dmodz_PS10_11\T' num2str(T) '\' siodmod])
% Each of the 6 PhilSea10 sources had a transmission delay for the actual.
% time of transmission. NOT required with SIO dmodx data, already applied.
% DelT = [-.0084;.0096;.0576;.0578;.073;-.006];
% Clock drift corrcetions already applied in SIO dmodx data
% Clock drift correction in sources and DVLA
dlt = length(dm.tax);
bfr = 2500;
rdlt = dlt - (2 * bfr);
tdelsc = dm.tax (bfr+1:(dlt - bfr));
% The dmodz files from Matt have dm.dmodx which includes only the clock
% drift corrections and the source delay time correction AND dm.dmod which
% have all the time corrections and the corrections for the source and
% receiver motion that correct for the displacement of the exact source and
% hydrophone positions relative to the source mooring anchor position and
% the DVLA anchor position respectively
tmfc = dm.dmodx(bfr+1:(dlt - bfr), Mods);
% Initialize some variables
D(T) = 0;
ThrSNR(T) = 0;
Tspreadmeas(T) = 0;
Tspread(T) = 0;
EOCfinal(T) = 0;
% Compute max amplitude and mean and variance of signal plus noise
MaxA(T) = max(abs (tmfc));
MeanSplusN(T) = mean (abs (tmfc));
SigSplusN(T) = sqrt (var (abs(tmfc)));
PreN(T) = mean(abs (tmfc(1:2000)));
PreS(T) = sqrt(var(abs(tmfc(1:2000))));
Dsig = (MaxA(T) - PreN(T))/PreS(T);
Nosignal(T) = 0;
if (Dsig <= 5)
   Nosignal(T) = 1;
end
% Noise limit is set at F * noise mean for CODA start detection using first
% 2 secs of MF time series preliminary noise mean estimate: PreN
MaxSNR(T) = 20 * log10(( MaxA(T)- PreN(T))/PreS(T));
FdB = 20 * log10 ((F-1)* PreN(T)/PreS(T));
if (MaxSNR(T) < FdB)
   NoiseMean(T) = MeanSplusN(T);
   NoiseSig(T) = SigSplusN(T);
   MaxSNR(T) = 20 * log10((MaxA(T)- NoiseMean(T))/NoiseSig(T));
end
% Set CODA start threshold THRS
THRS = F; % This means that the SNR must be greater than FdB, see above.
% Adjustment of threshold if Max SNR in the arrival. code >MST
if ((MaxSNR(T) - MST) > 0)
   THRS = ((10^((MaxSNR(T) - MST + FdB)/20))/1.913) + 1;
   if (THRS > (1.5 * F))
      THRS = 1.5 * F;
   end
end
Nlimit = PreN(T) * THRS;
if (MaxSNR(T) < FdB)
   Nlimit = NoiseMean(T) * THRS;
end
Tspreadflag = 0;
% Find length of arrival coda clipped at 15 dB down from peak power or at
% the mean signal+noise limit whichever is higher. Use lower threshold for
% beginning of coda, generally first arrivals very clean and distinct
% trading off max peak threshold versus noise estimate.
MAXA = max (abs (tmfc))/5.6; % 15 dB down from maximum peak power for end
```

```
if (Nlimit > MAXA)
   MAXA = Nlimit;
end
MAXA1 = Nlimit;
SOC = 0;
EOC = 0;
ISOC = 0;
IEOC = 0;
SOCFlag = 0;
for I = 1:rdlt-1
   if ( abs(tmfc (I+1)) > abs (tmfc (I))) && (abs (tmfc (I+1)) > MAXA1) && (SOC == 0)
      SOC = tdelsc (I);
      ISOC = I;
   end
   if ( abs(tmfc (I)) > abs (tmfc (I+1))) && (abs (tmfc (I)) > MAXA)
      EOC = tdelsc (I);
      IEOC = I;
   end
end
if (ISOC == 0)
   ISOC = 1;
   SOC = tdelsc(1);
   IEOC = rdlt-1;
   EOC = tdelsc(rdlt);
   SOCFlag = 1;
end
% If the measured time spread is greater than estimated time spread, raise
% the threshold to eliminate spurious peaks after EOC (e.g. BB for T6)
% Use estimate of CODA time spread as ~ avg, arrival time (SOC+EOC)/2
% divided by 170. Splitting the difference between Urick (~140) and some
% measurements from PhilSea10 (~200)
Tspreadmeas(T) = EOC - SOC;
Tspread(T) = (SOC + EPOC)/340; % expected time spread (traveltime/170)
if ((EOC - SOC) > Tspread(T))
   MAXAH = MAXA + .3 * MAXA;
   MAXAL = MAXA - .3 * MAXA;
   Istop = 100;
   Flag = 0;
   Ip = IEOC + Istop;
   if (Ip > rdlt)
      EOCfinal(T) = tdelsc(rdlt);
      Ip = rdlt;
   end
   Np = 0;
   for Ipd = 1:2*Istop
   if (abs(tmfc (Ip - Ipd)) > MAXAH)
      Flag = 1;
      break
   end
   end
   if (Flag == 0)
      for I = ISOC:IEOC - 50
         if (abs(tmfc (I)) > abs (tmfc (I+1))) && (abs (tmfc (I)) > MAXA)
            EOC = tdelsc (I);
            IEOC = I;
         end
      end
      Tspreadmeas(T) = EOC - SOC;
      if (Tspreadmeas(T) > Tspread(I))
         Tspreadflag = 1;
      end
   end
end
%Using full Tspreadmeas is conservative, use (IEOC-ISOC)/2 or even less
Nend = IEOC + round((IEOC - ISOC)/2);
   if (Nend > rdlt-1)
   Nend = rdlt-1;
   end
   Nstrt = ISOC - 500;
   if (Nstrt <= 0)
      Nstrt = 1;
   end
% Calculate noise mean and variance without signal prior to signal arrival
vec1 = abs (tmfc (1:Nstrt));
NoiseVec = vec1;
NoiseMean(T) = mean (NoiseVec);
NoiseSig(T) = sqrt ( var (NoiseVec));
% When there is no signal detected
if (MaxSNR(T) < FdB) % No peak greater than the threshold floor
```

```
    NoiseMean(T)= MeanSplusN(T);
    NoiseSig(T) = SigSplusN(T);
end
% Find the trailing edge of the EOC at the noise limit (computed without
% signal present)
MaxSNR(T) = 20 * log10(( MaxA(T)- NoiseMean(T))/NoiseSig(T));
FdB = 20 * log10 ((F-1)* NoiseMean(T)/NoiseSig(T));
% Set THR on MxSNR(T) - MST dB) with a floor of FdB dB or THR = F
THR = F;
if ((MaxSNR(T) - MST) > 0)
    THR = ((10^((MaxSNR(T) - MST + FdB)/20))/1.913) + 1;
end
THRT(T) = THR;
Nlimit2 = NoiseMean(T) * THR;
Nlimit2Flag = 0;
    if (Nlimit2 > MAXA)
    THRT(T) = MAXA/NoiseMean(T);
    Nlimit2 = MAXA;
    Nlimit2Flag = 1;
end
MAXB = Nlimit2;
MaxB(T) = MAXB;
%initialize for each source
edget = 0;
Iedget = 0;
for N = IEOC:Nend
    if ( abs(tmfc (N)) > abs (tmfc (N+1))) && (abs (tmfc (N)) >= MAXB)
        edget = tdelsc (N);
        Iedget = N;
    end
end
if (edget == 0)
    edget = tdelsc (rdlt);
    Iedget = rdlt;
    for ii = 1:rdlt-1
       if (abs(tmfc(ii)) == MaxA(T))
          if ( LB(T) < tdelsc(ii) && tdelsc(ii) < UB(T))
             Iedget = ii;
             edget = tdelsc(ii);
          end
       end
    end
end
EOCc(T) = edget;
EOCfinal(T) = edget;
EOCplot = edget;
%Compute detection index at the threshold MaxB
D(T) = ((MaxB(T)- NoiseMean(T)).^2)./(NoiseSig(T).^2);
ThrSNR(T) = 10 * log10(D(T));
NSRatio(T) = NoiseMean(T)/NoiseSig(T);
figure('renderer', 'painters', 'PaperPositionMode', 'auto')
plot (tdelsc, abs (tmfc))
hold on
plot (SOC, MAXA1, 'gd', 'MarkerFaceColor' , 'g')
plot (EOC, MAXA, 'gd', 'MarkerFaceColor' , 'g')
plot (tdelsc(Nend), MAXA, 'rd', 'MarkerFaceColor' , 'r')
plot (EOCfinal(T), abs(tmfc(Iedget)), 'b*')
plot (EOCfinal(T), MAXB, 'r*')
plot (tdelsc(Nstrt), MAXA, 'kd', 'LineWidth', 1.2)
plot (tdelsc(Nend), MAXA, 'kd', 'LideWidth', 1.2)
title (['D' num2str(jd) ' Mod' num2str(Mod) ' Ping ' num2str(P) ' Source ' num2str(T)'↵
ADN ' num2str(THR) '\mu ' num2str(F) '/' num2str(MST) ' dmodx'])
xlabel ('Time (secs)')
ylabel ('Amplitude')
if (Iedget == rdlt)
   text (.097, .94, ' EOCtime =N/A', 'Units', 'normalized')
else
text (.097, .94, [' EOCtime = ' num2str(EOCfinal(T))], 'Units', 'normalized')
end
text (.096, .9, ['     ThrSNR = ' num2str(ThrSNR(T))], 'Units', 'normalized')
text (.096, .86,['Threshold = ' num2str(MaxB(T))], 'Units', 'normalized')
text (.09, .82,['     Det Index = ' num2str(D(T))], 'Units', 'normalized')
text (.1, .78,['    \mu Noise = ' num2str(NoiseMean(T))], 'Units', 'normalized')
text (.1, .74,['    \sigma Noise = ' num2str(NoiseSig(T))], 'Units', 'normalized')
text (.1, .7,['\mu/\sigma Ratio = ' num2str(NSRatio(T))], 'Units', 'normalized')
text (.1, .66, ['Max Amp = ' num2str(MaxA(T))], 'Units', 'normalized')
text (.1, .62, ['Max SNR = ' num2str(MaxSNR(T))], 'Units', 'normalized')
```

-continued

```
text (.1, .58, ['TspreadM = ' num2str(Tspreadmeas(T))], 'Units', 'normalized')
text (.1, .54, ['TspreadE =' num2str(Tspread(T))], 'Units', 'normalized')
grid on
savefig (['D' num2str(jd) '_EOC_AD_Mod' num2str(Mod) '_P' char(P+48) '_T' num2str(T)↵
'_VTHN_' num2str(round(F)) '_' num2str(MST) 'dmodx'])
hold off
if (Iedget == rdlt)
   EOCfinal(T) = 0;
end
end
Tm = EOCfinal.';
Tspreadmeas;
D;
MaxA;
MeanSplusN;
NoiseMean;
MaxB;
NoiseSig;
FileN = ['D' num2str(jd) '_EOCAutoDet_Mod' num2str(Mod) '_P' char(P+48) '_VTHN_' num2str↵
(round(F)) '_' num2str(MST) 'dmodx.mat'];
save (↵
FileN, 'Tm','EOCc','Tspreadmeas','D','MaxA','MaxSNR','MeanSplusN','NoiseMean','PreN','MaxB↵
','NoiseSig','Tspread','THRT','NSRatio')
end
```

---

```
% Cold start position estimation code using travel times from PhilSea10
% experiment data. Computes x, y coordinates and aound speed, c, using a
% linearized least square estimate.
% Travel times are measured by the auto detection program of the End of
% Coda (EOC), the UNA_MATLAB_EOC_TravelTime_Detection.m program, using a
% calculated threshold and a measured and calculated CODA time spread
% limit.The threshold (THR) is variable based on the maximum SNR of the
% arrivals (MaxSNR) and the noise mean and variance measured from the data
% Clock drifts in DVLA and sources and source transmission delays are
% included in the UNA_MATLAB_EOC_TravelTime_Detection.m program
%---------------------------------------------------------------------------
% Peter Mikhalevsky
% Developed April 15, 2015
% Updated thru Sept 2016 included latest source/DVLA position and clock
% drift data from the Scripps Institution of Oceanography (SIO)
% March 29, 2017 Update to process SIO demodulated pulse compressed data
%---------------------------------------------------------------------------
clear all
% Enter Julian Day of data from PhilSea10
% Days available are 115 + 8n (n = 0,1,...41)and 191, 193, 197, 199, 449
% Days after 365 are Julian Day for 2011 (+ 365)
jd = 197;
% Variable THR based on fixed floor F * MeanNoise for MaxSNR < MST and a
% rising threshold for MaxSNR > MST
% Enter F and MST to load the desired .mat file from the
% UNA_MATLAB_EOC_TravelTime_Detection.m program
F = 5;
MST = 38;
%Enter DVLA Hydrophone Module #.
Mod = 15; % There are 149 hydrophone modules
Pend = 8; % Number of transmission sequences each day
MaxSNRPos(1:6,1:8) = 0; %Max SNR in arrival coda
NSRatioPos(1:6,1:8) = 0; %Ratio of noise mean to noise SD = 1.913 for
                                %Gaussian quadrature components of pulse
                                %compression
for iPing = 1:Pend % "Ping" is one complete 6 src XMIT sequence
% Load travel times "Tm" from UNA_MATLAB_EOC_TravelTime_Detection.m program
% and SNR and noise data
FileN = ['D' num2str(jd) '_EOCAutoDet_Mod' num2str(Mod) '_P' char(iPing+48) '_VTHN_'↵
num2str(FR) '_' num2str(MST) 'dmodx.mat'];
load (FileN, 'Tm', 'MaxSNR', 'NSRatio')
MaxSNRPos(1:6,iPing) = MaxSNR;
NSRatioPos(1:6,iPing) = NSRatio;
%Initialize matrices of source range statistics for each ping
Ract(1:6,iPing) = 0; % Actual range from source and DVLA xponder grids
Rpos(1:6,iPing) = 0; % LS fit range
Robs(1:6,iPing) = 0; "Observed" range with best fit c
Rerr(1:6,iPing) = 0; % Actual range error
Rfiterr(1:6,iPing) = 0; % LS fit range error
Cact(1:6,iPing) = 0; % "Actual" c using measured Tm travel time
Travt(1:6,iPing) = Tm;
```

```
%load source positions
load (['Day_' num2str(jd) '_SourcePos_Aug16.mat'])
% NS is number of sources with valid travel times. Tm = 0 is flag for no
% travel time detected (high noise, no signal ever thresholds, or missing
% T1 source on Ping 1 for day 191 and 197
NS = 0;
for id = 1:6
   STm(id) = 0;
   if (Tm(id) > 0)
      NS = NS + 1;
      STm(id) = 1;
      ATm(NS) = id;
   end
end
%Load ground truth hydrophone positions at each source transmission time
%To get hx and hy for hourly plot of hyd positions rerun HydMod_pos.m in
%info directory for MOD selected
FileH = ['Day_' num2str(jd) '_HydroMOD' num2str(Mod) '_Pos)_Aug16.mat'];
load(FileH)
%Using hydrophone position from Source 3 xmit time for ground truth
Xap = Xrs(3,1:Pend);
Yap = Yrs(3,1:Pend);
% Unknowns we are solving for
NUnk = 3; % x, y, and c
if (NS < NUnk)
   disp ('STOP: number of sources less than unkowns')
   return
end
%c = 0; %Takes slightly longer to converge but gives same result as using
         %nominal value of 1485 m/s as starting value
c = 1.485;
x0 = 0.0;
y0 = 0.0;
Xhat = [x0;y0;c];
for IT = 1:100
x0 = Xhat(1);
y0 = Xhat(2);
c = Xhat(3);
T = 1:NS;
% Vectorized Least Squares for computing (x,y) position and "best" c, with
% measured travel times
AT = ATm(T);
Re = Tm(AT) * c;
R0 = sqrt((Xs(AT,iPing) - x0).^2 + (Ys(AT,iPing) - y0).^2);
RA = sqrt((Xs(AT,iPing) - Xap(iPing)/1000).^2 + (Ys(AT,iPing) - Yap(iPing)/1000).^2);
B = Re(T) - R0(T);
A = [-(Xs(AT,iPing) - x0)./R0(T) - (Ys(AT,iPing) - y0)./R0(T) -Tm(AT)];
X = ((A.'*A)^(-1)*A.')*B;
Ract(AT,iPing) = RA; % Actual range from source and DVLA xponder grid
Rpos(AT,iPing) = R0; % LS fitrange
Robs(AT,iPing) = Re; % "Observed" range with best fit c
Rerr(AT,iPing) = R0 - RA; % Actual range error
Rfiterr(AT,iPing) = Re - R0; % LS fit range error
Cact(AT,iPing) = RA./Tm(AT); % "Actual" c using autodetect Tm tracel time
if ((abs(X(1)) < .0001) && (abs(X(2)) < .0001) && (abs(X(3)) < .0000005))
break
end
Xhat = Xhat + X;
end
Xhat = Xhat + X;
%Calculate covariance
Ex = B - A*X;
E = B;
DF = 0;
Sigma02 = 0;
DoF = NS - NUnk;
if (DoF > 0)
Sigma02 = (E.'*E)/DoF;
COV = Sigma02 *(A.'*A)^(-1);
DF = 1;
end
%Collect error statistice
Sig(iPing) = sqrt(Sigma02)*1000; % LS rms error (m)
Pose(iPing) = sqrt((Xap(iPing) - x0*1000)^2 + (Yap(iPing) - y0*1000)^2); %Position error
(m)
Xe(iPing) = x0*1000 - Xap(iPing); % X coordinate error (m)
Ye(iPing) = y0*1000 - Yap(iPing); % Y coordinate error (m)
cm(iPing) = c*1000; % LS c (m/s)
X0(iPing) = x0*1000; % LS X coordinate (m)
```

```
Y0(iPing) = y0*1000; % LS Ycoordinate (m)
%plot position results for ping "iPing" and sources 1-6
figure
C = ['r';'g';'b';'c';'m';'k'];
for iT = 1:NS
    AiT = ATm(iT);
t = 0:pi/720:2*pi;
x = Xs(AiT,iPing) + Re(iT)*cos(t);
y = Ys(AiT,iPing) + Re(iT)*sin(t);
plot (x,y,C(AiT))
hold on
end
%Plot ground truth and computed position
for iplot = 1:Pend
    plot (Xap(iplot)/1000,Yap(iplot)/1000, 'r.-')
end
plot (x0,y0,'b*')
%Plot error ellipse if number of equations > unknowns
if (NS > NUnk)
c11 = COV(1,1);
c22 = COV(2,2);
c12 = COV(1,2);
phi = .5 * atan(2*c12/(c11 - c22));
deg = 180*phi/pi;
%sig is set for confidence level desired
sig = 2.146; % sig = 1, CL = 39%; 2.146, CL = 90%; 2.448, CL = 95%
ra = sig * sqrt(.5 *(c11+ c22 + sqrt((c11+c22)^2 - 4* (c11*c22 - c12^2))));
rb = sig * sqrt(.5 *(c11+ c22 - sqrt((c11+c22)^2 - 4* (c11*c22 - c12^2))));
ellipse (ra,rb,pi/2-phi,x0,y0,'b');
end
axis ([-1,1,-1,1])
axis ('square')
grid on
title (['Day ' num2str(jd) ' Mod num2str(Mod) ' Ping ' num2str(iPing) ' AD (T3) Var THRN↵
' num2str(F) '/' num2str(MST) ' dmndx'])
xlabel ('East (kms)')
ylabel ('North (kms)')
text (.1, .36, [   ' POSerr = ' num2str(Pose(iPing))], 'Units', 'normalized')
text (.1, .32, ['     XPOS = ' num2str(X0(iPing))], 'Units', 'normalized')
text (.1, .28, [' XPOSerr = ' num2str(Xe(iPing))], 'Units', 'normalized')
text (.1, .24, ['     YPOS = ' num2str(Y0(iPing))], 'Units', 'normalized')
text (.1, .2,  [' XPOSerr = ' num2str(Ye(iPing))], 'Units', 'normalized')
text (.1, .16, ['LS Sigma = ' num2str(Sig(iPing))], 'Units', 'normalized')
text (.1, .12, ['              C = ' num2str(cm(iPing))], 'Units', 'normalized')
grid on
savefig (['D' num2str(jd) '_LSPos_Mod' num2str(Mod) '_Ping_' num2str(iPing)↵
'_T3_Hpos_Var_THRN' num2str(F) '_' num2str(MST) '_dmodx'])
hold off
end
%Done all pings for Mod#
%Plot all pings 1-8
Splot = (['D' num2str(jd) '_LSPos_Mod' num2str(Mod) '_All_Pings_T3_Hpos_Var_THRN' num2str↵
(F) '_' num2str(MST) '_dmodx'];
MeanPoserr = round(mean (Pose));
SigPoserr = round (sqrt (var(Pose)));
figure('renderer', 'painters', 'PaperPositionMode', 'auto')
plot (Xap, Yap, 'ro-','LineWidth', 1.2)
hold on
plot (Xap, Yap, 'r','MarkerSize',10)
plot (X0,Y0, 'b*-', 'LineWidth', 1.2)
plot (X0,Y0, 'b','MarkerSize',10)
text (.1, .09,['Red - Ground Truth Blue - Computed Cold Start Position'], 'Units',↵
'normalized')
text (.1, .18,['\mu Position Error =' num2str(MeanPoserr) ' meters'], 'Units',↵
snormall2ed')
text (.1, .14 ,r\sigma Position Error ' num2str(SigPoserr) ' metersl,
'normalized')
plot (hx,hy,'k.--')
hold on
plot (hx(1),hy(1),'g.','MarkerSize',15)
grid on
title (['D' num2str(jd) ' LSPos Mod' num2str(Mod) ' All Pings (T3 Hpos) Var THRN' num2str↵
(F) '/' num2str(MST) ' dmodx'])
savefig(Splot)
```

```
S = ([Splot , '.mat']);
%Save dote
save (S↵
,'Xap','Yap','X0','Y0','Pose','Sig','Xe','Ye','cm','Ract','Rpos','Robs','Rerr','Rfiterr',↵
'Cact','Travt', 'MaxSNRPos', 'NSRatioPos')
```

The invention claimed is:

1. A process for determining a location of an underwater vehicle without prior location or any ocean sound speed information for the underwater vehicle comprising:
    receiving, at a receiver hydrophone located on the underwater vehicle, acoustic signals from a predetermined number of acoustic sources of known location, wherein the predetermined number of acoustic sources is greater than 1;
    determining, by an onboard processor, an end of the Coda (EOC) travel time for each of the received acoustic signals from each of the sources; and
    applying, by the onboard processor, iterative linearized least squares estimation to the determined EOC travel times for each of the received acoustic source signals to determine absolute x, y, coordinates and c, wherein x is latitude, y is longitude, and c is ocean sound speed;
    determining a value for depth (z); and
    generating the location of the underwater vehicle using absolute x, y coordinates, c and z.

2. The process according to claim 1, further comprising determining the value for z using a pressure sensor on the underwater vehicle.

3. The process according to claim 1, wherein each of the predetermined number of acoustic sources of known location are underwater.

4. The process according to claim 1, wherein the predetermined number of acoustic sources of known location is at least five for an ocean area on the order of 0.5 to 1 million kilometers.

5. The process according to claim 1, wherein determining an EOC travel time uses a pulse compressed time series of each the received acoustic signal.

6. The process according to claim 1, wherein determining an EOC travel time includes first determining a variable threshold as a function of one or more of the following measured parameters: noise level, signal to noise ratio and signal duration.

7. The process according to claim 1 further comprising:
    computing a modeled acoustic signal arrival result from each of the predetermined number of acoustic sources of known location to the computed underwater vehicle position, wherein the modeled acoustic signal arrival result is computed for each of the predetermined number of acoustic sources of known location using a predetermined 4D sound speed field and an acoustic propagation modeling program; and
    comparing the computed modeled arrival result to a received acoustic arrival result, wherein the received acoustic arrival result is computed using received acoustic signals.

8. The process according to claim 7, wherein the modeled acoustic signal arrival results for each of the predetermined number of acoustic sources of known location are shifted in time to match the received acoustic arrival results for each of the predetermined number of acoustic sources of known location.

9. A computer readable storage medium having data stored therein representing software executable by a computer, the software including instructions to determine a location of an underwater vehicle without prior location or any ocean sound speed information for the underwater vehicle comprising:
    instructions for processing acoustic signals, arriving at the underwater vehicle, from a predetermined number of acoustic sources of known location, wherein the predetermined number of acoustic sources is greater than 1;
    instructions for determining an end of the Coda (EOC) travel time for each of the received acoustic signals from each of the sources; and
    instructions for applying iterative linearized least squares estimation to the determined EOC travel times for each of the received acoustic source signals to determine absolute x, y, coordinates and c, wherein x is latitude, y is longitude, and c is ocean sound speed;
    further wherein a value for x, y and c are the values that minimize the sum of squared errors of ranges from each of the acoustic sources of known location to a computed underwater vehicle position including the determined absolute x, y and further wherein a value for a depth z is known.

10. The computer readable storage medium according to claim 9, wherein the instructions for determining an EOC travel time includes first determining a variable threshold as a function of one or more of the following measured parameters: noise level, signal to noise ratio and signal duration.

11. The computer readable storage medium according to claim 9, further comprising:
    instructions for computing a modeled acoustic signal arrival result from each of the predetermined number of acoustic sources of known location to the computed underwater vehicle position, wherein the modeled acoustic signal arrival result is computed for each of the predetermined number of acoustic sources of known location using a predetermined 4D sound speed field and an acoustic propagation modeling program; and
    instructions for comparing the computed modeled arrival result to a received acoustic arrival result, wherein the received acoustic arrival result is computed using received acoustic signals.

12. The computer readable storage medium according to claim 11, wherein the instructions for comparing the computed modeled arrival result to a received acoustic arrival result includes instructions for shifting the modeled acoustic signal arrival results for each of the predetermined number of acoustic sources of known location in time to match the received acoustic data arrival results for each of the predetermined number of acoustic sources of known location.

13. A system for determining a location of an underwater vehicle without prior location or any ocean sound speed information for the underwater vehicle comprising:
    at least one receiver hydrophone located on the underwater vehicle for receiving acoustic signals from a predetermined number of acoustic sources of known location, wherein the predetermined number of acoustic sources is greater than 1; and a specifically programmed processor, programmed with instructions to:
- determine an end of the Coda (EOC) travel time for each of the received acoustic signals from each of the predetermined number of acoustic sources of known location; and
- apply iterative linearized least squares estimation to the determined EOC travel times for each of the received acoustic source signals to determine absolute x, y, coordinates and c, wherein x is latitude, y is longitude, and c is ocean sound speed, wherein the values for x, y and c minimize a sum of squared errors of ranges from each of the known acoustic sources to a computed underwater vehicle position including determined absolute x, y and further wherein a value for a depth z is known.

14. The system according to claim 13, further comprising:
an inertial navigation system for providing additional information for use in determining a location of the underwater vehicle.

15. The system according to claim 13, wherein the specifically programmed processor is further programmed with instructions for determining an EOC travel time including first determining a variable threshold as a function of one or more of the following measured parameters: noise level, signal to noise ratio and signal duration.

16. The system according to claim 13, wherein the specifically programmed processor is further programmed with: instructions for computing a modeled acoustic signal arrival result from each of the predetermined number of acoustic sources of known location to the computed underwater vehicle position, wherein the modeled acoustic signal arrival result is computed for each of the predetermined number of acoustic sources of known location using a predetermined 4D sound speed field and an acoustic propagation modeling program; and
instructions for comparing the computed modeled arrival result to a received acoustic arrival result, wherein the received acoustic arrival result is computed using received acoustic signals.

17. The system according to claim 16, wherein the instructions for comparing the computed modeled arrival result to a received acoustic arrival result includes instructions for shifting the modeled acoustic signal arrival results for each of the predetermined number of acoustic sources of known location in time to match the received acoustic arrival results for each of the predetermined number of acoustic sources of known location.

18. The system according to claim 13, wherein the specifically programmed processor is further programmed with:
instructions for calculating acoustic group speeds for each of the predetermined number of acoustic sources from a 4D GCM OAT constrained ocean model to the determined absolute x, y and z; and
instructions for comparing the calculated group speeds to c and correcting the determined x or y in accordance with differences there between.

* * * * *